United States Patent
Zimmerman et al.

(10) Patent No.: US 10,541,009 B2
(45) Date of Patent: Jan. 21, 2020

(54) WRITE DATA MASK FOR POWER REDUCTION

(71) Applicant: Intel Corporation, Santa Clara, CA (US)

(72) Inventors: David J. Zimmerman, El Dorado Hills, CA (US); Robert M. Ellis, Hillsboro, OR (US); Rajesh Sundaram, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 15/857,349

(22) Filed: Dec. 28, 2017

(65) Prior Publication Data

US 2019/0035437 A1     Jan. 31, 2019

(51) Int. Cl.
*G06F 3/06* (2006.01)
*G11C 7/10* (2006.01)

(52) U.S. Cl.
CPC ............ *G11C 7/1009* (2013.01); *G06F 3/061* (2013.01); *G06F 3/0658* (2013.01); *G06F 3/0688* (2013.01)

(58) Field of Classification Search
CPC ...... G06F 3/061; G06F 3/0658; G06F 3/0688; G11C 7/1009; G11C 7/1078
See application file for complete search history.

(56) References Cited

U.S. PATENT DOCUMENTS

2008/0239886 A1* 10/2008 Ito .................. G11B 20/1217
369/30.01
2013/0219134 A1* 8/2013 Macri .................. G06F 12/00
711/154

* cited by examiner

*Primary Examiner* — Aracelis Ruiz
(74) *Attorney, Agent, or Firm* — Thorpe North & Western, LLP (57) ABSTRACT

Devices, systems, and methods having increased efficiency selective writing to memory are disclosed and described. A memory controller, upon receiving a dirty data segment, performs a read-modify-write to retrieve a corresponding data line from memory, saves a copy of the data line, merges the dirty data segment into the appropriate location in the data line to create a modified data line, and generates a write mask from the modified data line and the copy of the data line.

23 Claims, 7 Drawing Sheets

WRITE DATA MASK FOR POWER REDUCTION

BACKGROUND

Computer systems operate by executing instruction sequences that form a computer program. These instructions sequences are stored in a memory subsystem, along with any data operated on by the instructions, both of which are retrieved as necessary by a processor, such as a central processing unit. The speed of CPUs has increased at a much faster rate compared to the memory subsystems upon which they rely for data and instruction code, and as such, memory subsystems can be a significant performance bottleneck. While one solution to this bottleneck would be to primarily use in a computer system only very fast memory, such as static random-access memory, the cost of such memory would be prohibitive. In order to balance cost with system performance, memory subsystem architecture is typically organized in a hierarchical structure, with faster expensive memory operating near the processor at the top, slower less expensive memory operating as storage memory at the bottom, and memory having an intermediate speed and cost, operating in the middle of the memory hierarchy.

Further techniques can be implemented in order to further improve the efficiency of a memory hierarchy. For example, cache buffering of data between memory levels can reduce the frequency that lower speed memory is accessed. Additionally, differences in the granularity of a line of data between memory levels of the hierarchy can increase the efficiency of data movement between these levels by increasing the amount of data that is written to, or read from, the slower memory tier per memory request.

DESCRIPTION OF EMBODIMENTS

Although the following detailed description contains many specifics for the purpose of illustration, a person of ordinary skill in the art will appreciate that many variations and alterations to the following details can be made and are considered included herein. Accordingly, the following embodiments are set forth without any loss of generality to, and without imposing limitations upon, any claims set forth. It is also to be understood that the terminology used herein is for describing particular embodiments only, and is not intended to be limiting. Unless defined otherwise, all technical and scientific terms used herein have the same meaning as commonly understood by one of ordinary skill in the art to which this disclosure belongs. Also, the same reference numerals, when appearing in different drawings, represent the same or similar element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various embodiments. One skilled in the relevant art will recognize, however, that such detailed embodiments do not limit the overall concepts articulated herein, but are merely representative thereof. One skilled in the relevant art will also recognize that the technology can be practiced without one or more of the specific details, or with other methods, components, layouts, etc. In other instances, well-known structures, materials, or operations may not be shown or described in detail to avoid obscuring aspects of the disclosure.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open-ended term in this written description, like "comprising" or "including," it is understood that direct support should be afforded also to "consisting essentially of" language as well as "consisting of" language as if stated explicitly and vice versa.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually. This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of phrases including "an example" or "an embodiment" in various places throughout this specification are not necessarily all referring to the same example or embodiment.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

An initial overview of embodiments is provided below, and specific embodiments are then described in further detail. This initial summary is intended to aid readers in understanding the disclosure more quickly, but is not intended to identify key or essential technological features, nor is it intended to limit the scope of the claimed subject matter.

In many traditional memory hierarchies, the granularity of a line of data changes between levels of memory or cache in the hierarchy. For example, a processor may have a read/write granularity of 64 bytes, while an associated cache may have a read/write granularity that is a multiple of 64 bytes. Depending on the specific architecture of a system, there can be differences in granularity between any two memory or cache levels, and there can be two or more different granularities along the data pathway from the processor to memory storage. As one specific nonlimiting example, a processor may send read/write requests for data in 64-byte chunks (a 64-byte data line), while a memory storage device serving the processor may read/write data in 256-byte chunks (a 256-byte data line). Due to the relatively slow data access speeds of memory storage devices, this granularity change can increase the efficiency of data movement between the processor and the memory storage device by increasing the amount of data that is written to or read from the memory storage device per memory request. It is noted that the example sizes of 64 bytes and 256 bytes are merely exemplary, and that any granularity, or any combination of granularities, is contemplated. Additionally, much of the following is described in terms of writing data to memory storage. This is merely for convenience, and it should be understood that the description can apply to any level of the memory hierarchy where a change in granularity occurs.

Because data is written to memory storage as a data line (storage line) that is greater in size than the line of data in cache (cache line), when a dirty cache line (i.e., a cache line having data that has been changed relative to the data in memory storage) is evicted from the cache, a corresponding storage line is retrieved from memory storage and merged with the dirty cache line. In other words, the segment of the storage line corresponding to the dirty cache line is removed and replaced with the dirty cache line. This process thus generates a storage line that includes the dirty cache line to generate a full storage line that is the proper storage line-size to be written to memory storage. This process is known as a Read-Modify-Write (RMW) because, to write a subset of a storage line, the storage line is read from memory storage, modified, and then written back to memory storage. As such, data that has been read from cache, memory, memory storage, or any other level of the hierarchy, for the purpose of merging with dirty data to generate a data line of a greater size, is referred to herein as RMW data or a RMW line.

One caveat, however, relates to the inefficiency of writing a storage line back to memory storage that includes clean (or unmodified) data. For example, one technique is to write all data bits in the storage line back to the memory storage regardless of whether they have been changed or not relative to the data of the storage line in the memory storage. This technique unnecessarily expends the already limited bandwidth (i.e., increased memory latency) of the memory storage subsystem and can greatly increase the power overhead for each write. In another technique, only the data bits that have been changed relative to the data in memory storage are written back, which can greatly increase the bandwidth of the memory storage subsystem and reduce the power overhead per write. In order to write only the changed bits, however, the storage line needs to be read a second time from memory storage, which is used to identify the bits that have changed to thus generate a data mask. While this technique saves power, and reduces memory latency by only writing changed or dirty bits, the second read of the storage line additionally has a negative impact on memory latency and power usage.

The present disclosure provides description of a technique that reduces memory latency and power usage by eliminating the need for a second or subsequent read of data to generate a data mask, such as a write mask. Such can apply to any operation for which a subsequent or second read of data is used to generate the mask, such as a RMW operation, a wear-leveling operation, or the like. For example, in a read operation to retrieve a RMW line for merging with a dirty cache line, a copy is saved of the RMW line. This RMW line copy is then used to generate the write mask, thus avoiding the second read of the RMW data. While the following disclosure primarily uses the term "RMW," such is merely for convenience, and RMW is considered to describe any type of a data retrieval from memory in a write operation where a second read of the data is traditionally performed for use in generating a write mask. It is noted that, to avoid terminology confusion, a data line having a higher granularity (e.g., a storage line) is referred to herein as a "data line," and a data line having a lower granularity (e.g., a cache line) is referred to herein as a "data segment."

Figure 1:
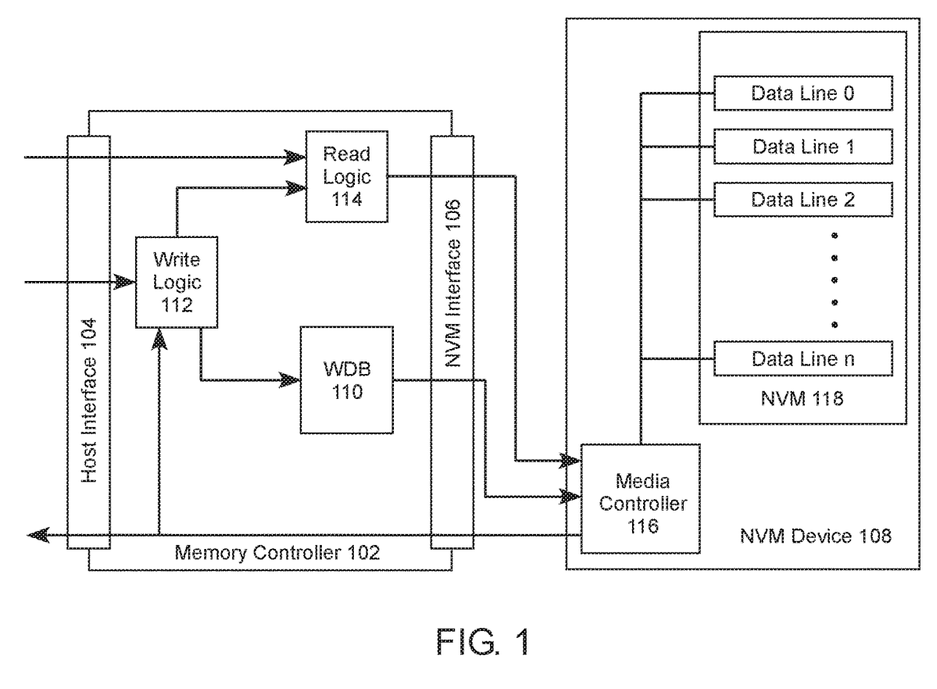
FIG. 1 illustrates a block diagram of a memory subsystem in accordance with an example embodiment.

In one example, as shown in FIG. 1, a memory controller 102 includes a host interface 104 for data and command communication with a host, and a memory interface, such as a NVM interface 106, for data and command communication with a memory device, such as a NVM device 108. The memory controller 102 further includes a write data buffer (WDB) 110, a write logic 112, and a read logic 114. The WDB 110 provides a buffer to temporarily store data prior being sent to the NVM device 108. In general, the stored data can be a full data line or a partial data line that includes one or more data segments. As such, a dirty data segment evicted from a host cache, for example, can be sent to the memory controller 102 through the host interface 104, where the write logic 112 receives the dirty data segment. If the data line corresponding to the dirty data segment is not present in the WDB 110, the write logic 112 sends a request to the read logic 114 to retrieve the corresponding data line from the NVM device 108 as a RMW line. In one example, the read logic 114 sends a read request for the data line to a media controller 116 in the NVM device 108. The media controller 116 generates the appropriate read commands to retrieve the requested data line from a NVM 118 in the NVM device 108, which is returned to memory controller 102 as a RMW line. A copy of the RMW line is saved in the memory controller 102 for use in generating a write mask.

The write logic 112 can merge the RMW line and the dirty data segment to generate a modified data line, which is stored in the WDB 110. This manipulation of the RMW line and the dirty data segment can be performed according to a variety of techniques, which is not limiting. In one implementation, for example, the write logic 112 can include an arbitration buffer in which incoming data can be stored during arbitration. Once received from the NVM 118, the write logic 112 can store the RMW line to an entry of the WDB 110 and retrieve the dirty data segment from the arbitration buffer, which is written over the corresponding RMW line segment in the WDB 110 to generate the modified data line. In another example, the write logic 112 can initially store the incoming dirty data segment to an entry the WDB 110 and, once received from the NVM 118, write the RMW line segments to the entry of the WDB 110 that do not correspond to the dirty data segment, thus generating the modified data line.

If, upon receiving a dirty data segment, the write logic 112 determines that the data line corresponding to the dirty data segment is present in the WDB 110, the write logic 112 merges the incoming dirty data segment with the data line (which can be, in some cases, a RMW line) at the appropriate segment location in the entry of the WDB 110, without having to perform a RMW for that dirty data segment. In one example, the write logic can perform the merge by overwriting the appropriate segment of the data line with the dirty data line in the WDB 110. Once a write mask is generated from the copy of the RMW line and the modified data line, the memory controller 102 sends the modified data line, a write request, and the write mask to the media controller 116. The media controller 116 uses the write mask to drive only the bit-lines corresponding to the dirty data bits of the modified data line, thus writing only to the NVM bits corresponding to bits of data that have changed in the dirty data segment.

Figure 2:
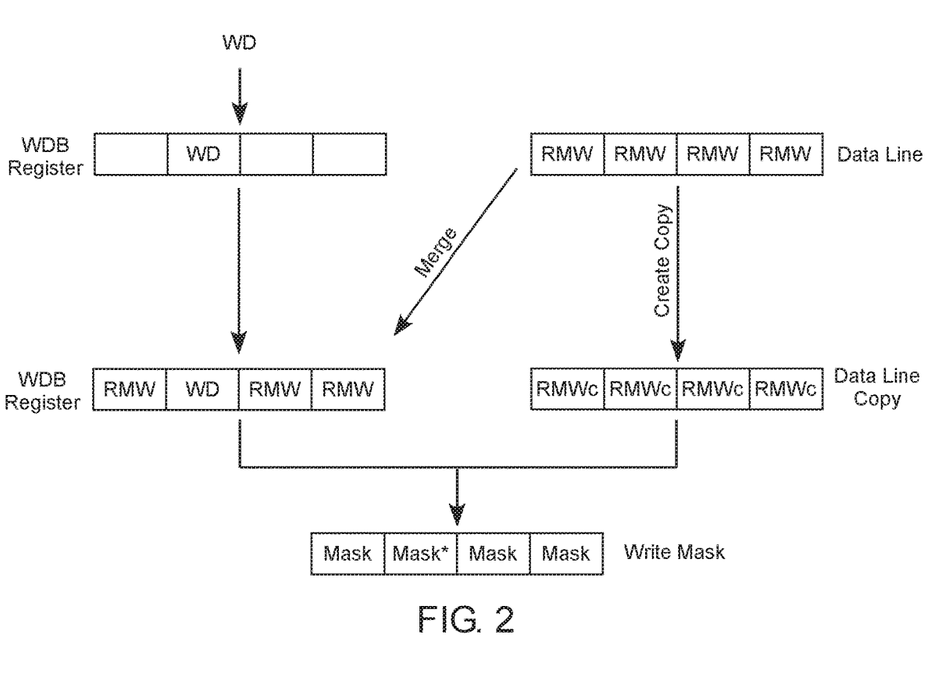
FIG. 2 illustrates a flow of data manipulation in a memory subsystem in accordance with an example embodiment.

FIG. 2 shows an exemplary flow of data manipulation to generate a write mask. A dirty data segment, denoted as write data (WD), is received by the write logic 112 and entered into a WDB register entry (i.e., WDB entry) at a corresponding location of the data segment in the data line. In this case, WD is shown in the second of four data segment positions of the WDB entry. In some examples, this location can be an offset value from the starting point of the data line, which corresponds with the starting point of the data portion of the WDB entry. The data line of RMW data is merged with WD in the WDB entry to generate a modified data line. As can be seen in this example, the RMW data segment corresponding to WD is removed, and the remaining RMW data segments corresponding to the first, third, and fourth positions are entered into the WDB entry at the appropriate offset. It is noted, however, that in other examples the RMW line can first be written to the WDB register, and the WD can be subsequently written over the corresponding RMW segment. As such, merging the dirty data segment with a RMW line can include writing the dirty data segment to the WDB entry and subsequently writing the remaining RMW line segments to the WDB entry to generate the modified data line, writing the RMW line to the WDB entry and subsequently writing the dirty data segment to the WDB entry over the corresponding data segment of the RMW line to generate the modified data line, or merging the dirty data segment with the RMW line outside of the WDB to generate the modified data line, and then writing the modified data line to the WDB entry.

A write mask is generated from the modified data line and a copy of the RMW line (RMW line copy or RMWc) that has been retained in the memory controller. The portion of the write mask corresponding to WD is marked in FIG. 2 as Mask*. The write mask can be any type of masking technology that allows the selective writing of dirty bits of a dirty data segment to a memory location, and as such, is not limiting. In one example, a bit-wise operation is performed between the modified data line and the RMW line copy to generate the write mask. In one example, the write mask can be generated by performing a bit-wise XOR operation between the modified data line and the RMW line copy. Generating the write mask can occur at any point along the transmission pathway from the WDB 110 and the media controller 116. For example, the write mask can be generated by write mask logic as the modified data line exits the WDB 110. In another example, the write mask can be generated by write mask logic in the NVM interface 106. As such, the write mask can be generated within the memory controller 102 and sent, along with the modified data line and a write request, to the media controller 116.

Figure 3:
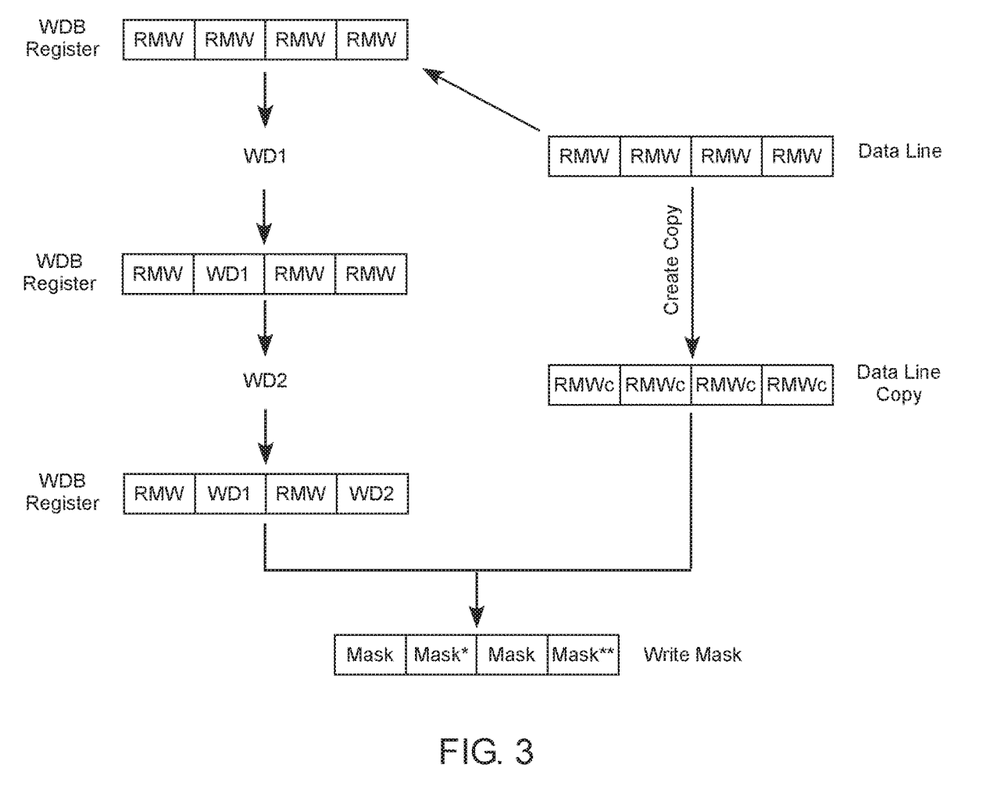
FIG. 3 illustrates a flow of data manipulation in a memory subsystem in accordance with an example embodiment.

FIG. 3 shows a nonlimiting example of a flow of data manipulation to generate a write mask. A dirty data segment (WD1) is received by the write logic 112 and buffered until a corresponding data line (RMW line) can be retrieved from the NVM 108. The RMW line is entered into a WDB entry, and the buffered WD1 is written over a corresponding RMW data segment at the appropriate location. In this case, WD1 is shown in the second of four data segment positions of the WDB entry. In some examples, this location can be an offset value from the starting point of the data line, which corresponds with the starting point of the data portion of the WDB entry. The WD1 is thus merged with the RMW line in the WDB entry to generate a modified data line. Prior to eviction of the modified data line from the WDB 110, the write logic 112 receives a second (or subsequent) dirty data segment (WD2) corresponding to the modified data line containing WD1 that is present in the WDB entry. WD2 is entered into the WDB entry by overwriting the corresponding RMW data segment at the appropriate WDB entry location. In this case, WD2 is shown in the fourth of four data segment positions of the WDB entry. WD2 is merged with the modified data line in the WDB entry. As can be seen in this example, the RMW data segment corresponding to WD2 is removed and replaced with WD2.

In one example, the WDB 110 can maintain a set of status bits for each WDB entry. These status bits can provide indicators for any useful state of data stored in the WDB entry, including the status of individual data segments and entire data lines. For example, in one example each segment of a WDB entry can include a dirty status bit that can indicate whether or not the associated segment contains a dirty data segment. In another example, a WDB entry can include a RMW Issued status bit that indicates whether or not a RMW operation (or command) has been issued. In another example, a WDB entry can include a RMW Complete status bit that indicates whether or not a RMW operation has been completed.

Depending on the eviction policy of the WDB, the modified data line can remain in the WDB entry until more of the RMW data segments have been replaced with corresponding dirty data segments. Following eviction of the modified data line from the WDB 110, a write mask can be generated from the modified data line and a RMW line copy (RMWc) that has been retained in the memory controller. The portion of the write mask corresponding to WD1 is marked as Mask* and the portion of the write mask corresponding to WD2 is marked as Mask**. The write mask can be any type of masking technology that allows the selective writing of dirty bits of a dirty data segment to a memory location, and as such, is not limiting. In one example, a bit-wise operation is performed between the modified data line and the RMW line copy to generate the write mask. In one example, the write mask can be generated by performing a bit-wise XOR operation between the modified data line and the RMW line copy. Generating the write mask can occur at any point along the transmission pathway from the WDB 110 and the media controller 116. For example, the write mask can be generated by write mask logic as the modified data line exits the WDB 110. In another example, the write mask can be generated by write mask logic in the NVM interface 106. As such, the write mask can be generated within the memory controller 102 and sent, along with the modified data line and a write request, to the media controller 116.

Figure 4:
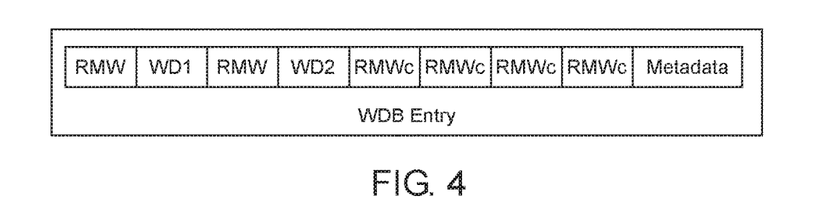
FIG. 4 illustrates an example of a write data buffer entry in accordance with an example embodiment.

The RMW line copy can be stored in the memory controller at various locations, which is not limiting. FIG. 4 shows an example of the RMW line copy stored in the WDB entry with the modified data line, using the modified data line example from FIG. 3. The WDB entry is thus shown to include the RMW line copy, metadata, and the modified data line including the two dirty data segments WD1 and WD2, and two RMW data segments. The metadata can include related data, such as physical address information, virtual address information, various status bits, and the like. In order to accommodate the RMW line copy, the width of the WDB is increased by at least the size of the RMW line copy. For example, for a 256 byte modified data line, a 512-byte wide WDB would accommodate both the modified data line and the write mask.

Figure 5:
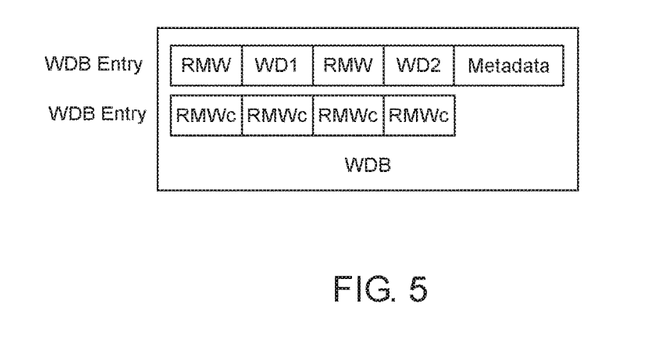
FIG. 5 illustrates an example of a write data buffer entry in accordance with an example embodiment.

In another example, the RMW line copy can be stored in the WDB in a WDB entry that is different from the WDB entry storing the modified data line. FIG. 5 shows such an example, where one WDB entry contains metadata and the modified data line including the two dirty data segments WD1 and WD2, and two RMW data segments, and another WDB entry contains the RMW line copy. The WDB entry containing the RMW line copy is indexed to the WDB entry containing the modified data line to associate the RMW line copy with the corresponding modified data line for generating the write mask. It is, therefore, not necessary in this configuration to increase the width of the WDB to accommodate the RMW line copy. In some cases, however, the number of WDB entries in the WDB can be increased to accommodate the buffering of the RMW line copies.

Figure 6:
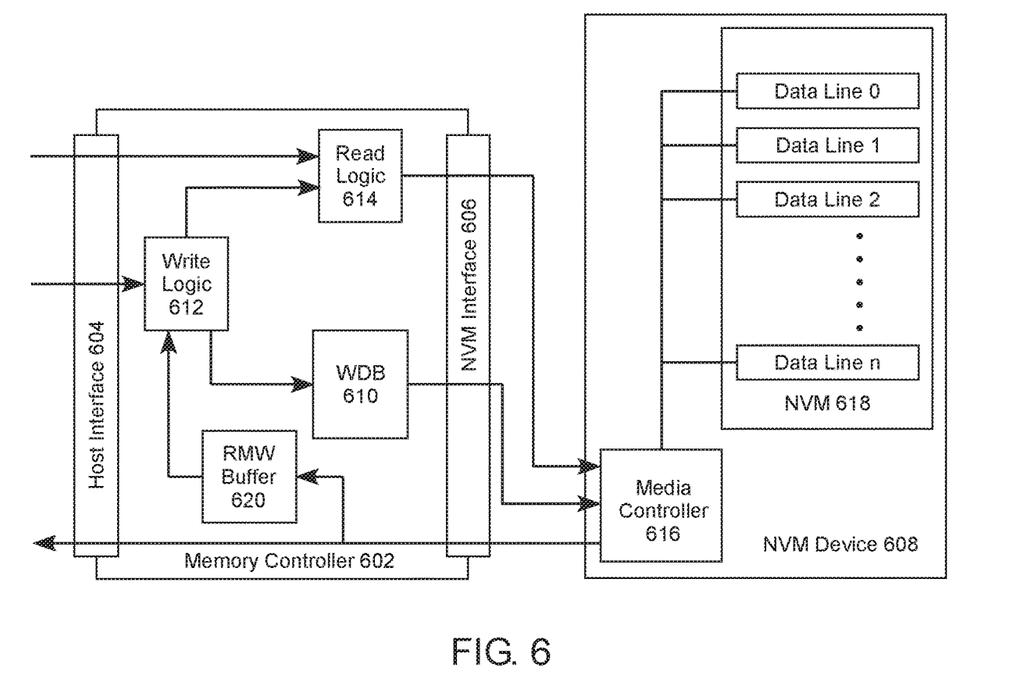
FIG. 6 illustrates a block diagram of a memory subsystem in accordance with an example embodiment.

In another example, the RMW line copy can be stored, at least temporarily, in a buffer separate from the WDB. FIG. 6 shows one example of a memory controller 602 including a host interface 604 for data and command communication with a host, and a memory interface, such as a NVM interface 606, for data and command communication with a memory device, such as a NVM device 608. The memory controller 602 further includes a WDB 610, a write logic 612, and a read logic 614. The WDB 610 provides a buffer to temporarily store data prior being sent to the NVM device 608. If, upon receiving a dirty data segment from a host through the host interface 604, the write logic 612 determines that the data line corresponding to the dirty data segment is not present in the WDB 610, the write logic 612 sends a request to the read logic 614 to retrieve the data line corresponding to the dirty data segment from the NVM device 608 as a RMW line. In one example, the read logic 614 sends a read request for the data line to a media controller 616 in the NVM device 608. The media controller 616 generates the appropriate read commands to retrieve the requested data line from a NVM 618 in the NVM device 608, which is returned as a RMW line to a RMW buffer 620 in memory controller 602. The write logic 612 is communicatively coupled to the RMW buffer 620, and can arbitrate between host write data, such as dirty data segments, and data from the RMW buffer 620. Once in the RMW buffer 620, the write logic 612 can retrieve the RMW line, generate a copy of the RMW line for use in generating the write mask, and merge the dirty data segment with the RMW line as described herein. In one example, the write logic 612 can generate the copy by leaving a copy of the RMW line in the RMW buffer 620. In another example, the write logic 612 can write a copy of the RMW line to the WDB 610, either in the same entry with the modified data line or in a separate entry from the modified data line.

If, upon receiving a dirty data segment, the write logic 612 determines that the data line corresponding to the dirty data segment is present in the WDB 610, the write logic 612 merges the incoming dirty data segment with the data line (which can be, in some cases, a RMW line) at the appropriate segment location in the entry of the WDB 610, without having to perform a RMW for that dirty data segment.

Once the modified data line is evicted from the WDB 610, the write mask is generated from the copy of the RMW line and the modified data line, and the memory controller 602 sends the modified data line, a write request, and the write mask to the media controller 616. The media controller 616 generates the appropriate write commands, and uses the write mask to drive only the bit-lines corresponding to the dirty data bits of the modified data line, thus writing only to the NVM bits corresponding to bits of data that have changed in the dirty data segment.

Figure 7:
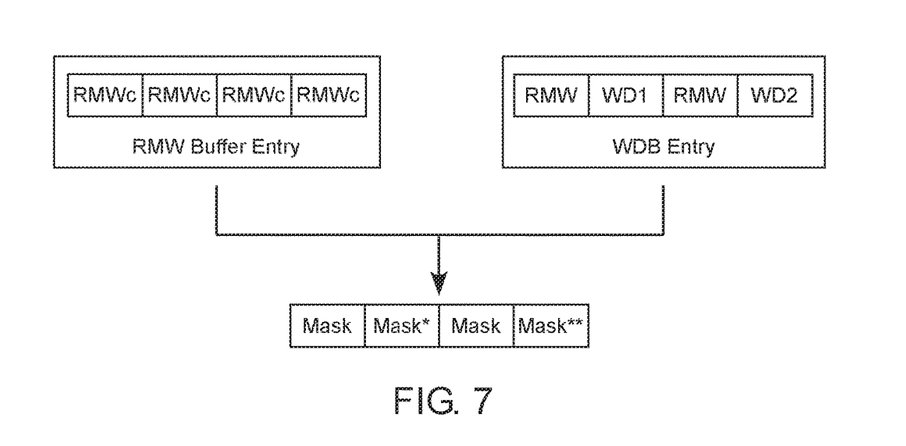
FIG. 7 illustrates a flow of data manipulation in a memory subsystem in accordance with an example embodiment.
Figure 8:
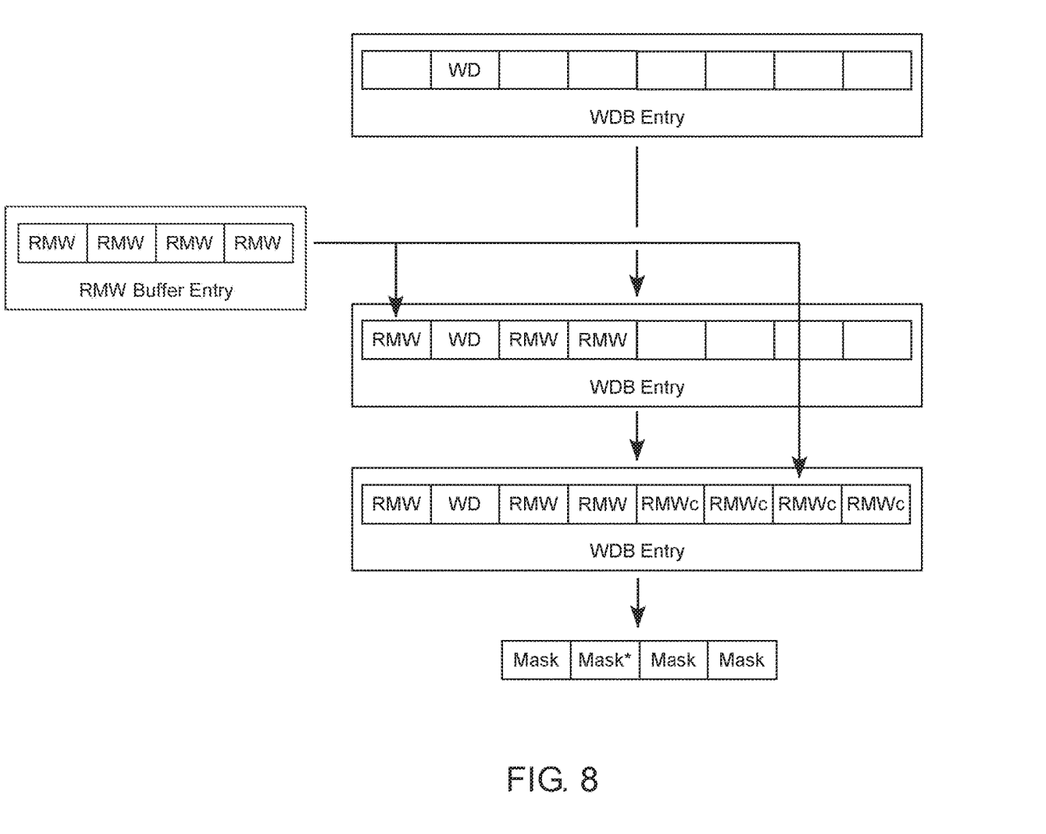
FIG. 8 illustrates a flow of data manipulation in a memory subsystem in accordance with an example embodiment.

In one example, the RMW line copy can be stored in the RMW buffer 620 until needed for generating the write mask, as is shown in FIG. 7. To generate the write mask, a bitwise operation is performed between the modified data line from the WDB entry and the corresponding RMW line copy from the RMW buffer entry. In another example, the RMW data can be stored temporarily in the RMW buffer 620 and then moved to the WDB 810 and stored, as described above. An example where the RMW line copy is stored in the same WDB entry as the corresponding modified data line is shown in FIG. 8. Starting at the top of the flow, the dirty data segment (WD) is entered into the appropriate location in the WDB entry. The data from the RMW line stored in the RMW buffer entry is retrieved and merged with WD in the WDB entry to generate the modified data line. A copy of the RMW line is entered into the WDB entry with the modified data line, and subsequently used to generate the write mask.

Figure 9:
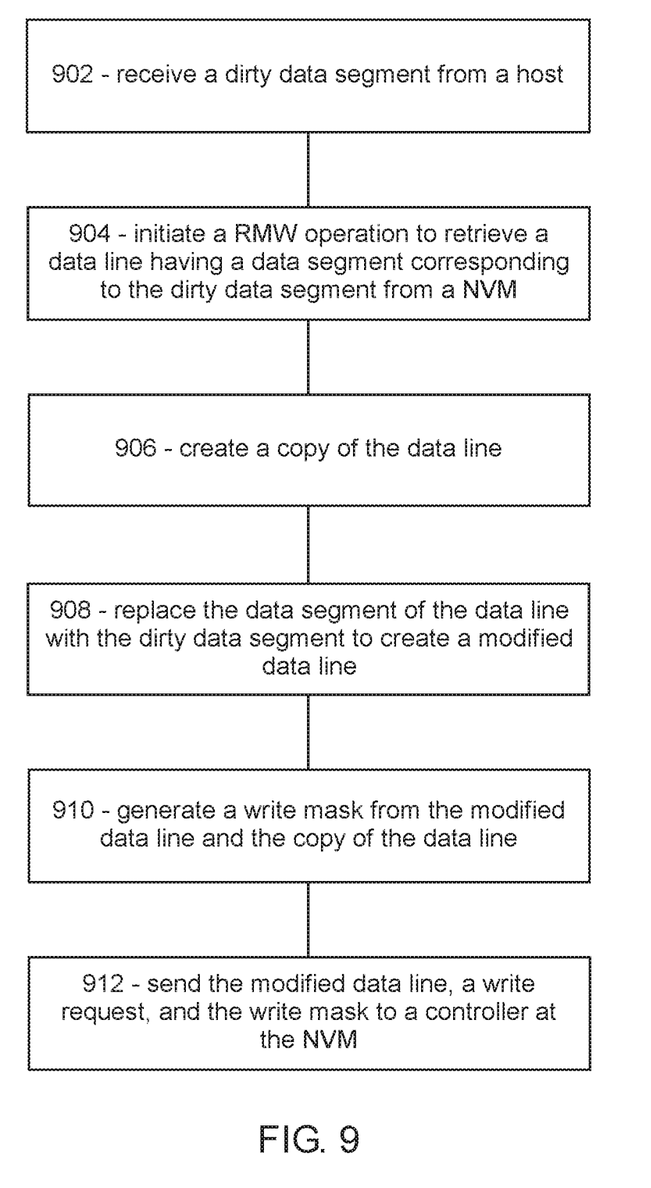
FIG. 9 illustrates a method flow performed by components of a computing system in accordance with an example embodiment.

Various architectural configurations are contemplated for the devices, systems, and methods encompassed by the present disclosure. For example, the memory controller can be a processor-side memory controller, such as an integrated memory controller on-die with a processor, an off-die memory controller, a NVM controller that can be either on or off the NVM device, or any other controller that performs multiple data reads from a memory to perform a selective write operation. In one example, as is shown in FIG. 9, the memory controller 902 receives a dirty data segment from a host and 904 initiates a RMW operation to retrieve a data line having a data segment corresponding to the dirty data segment from a NVM, which in some cases can be a write-in-place NVM. The memory controller 906 creates a copy of the data line, 908 replaces the data segment of the data line with the dirty data segment to create a modified data line, and 910 generates a write mask from the modified data line and the copy of the data line. The memory controller 912 sends the modified data line, a write request, and the write mask to a controller (e.g., a media controller) at the NVM to selectively write only the bits of data that have been changed in the dirty data segment.

In some cases, the dirty data segment can be retained in the WDB until evicted according to an eviction policy, and subsequently evicted upon the occurrence of an eviction criterion of the eviction policy. The dirty data segment can be retained in the WDB for a number of reasons. In one example, retention can be to buffer incoming write requests. In another example, eviction can be delayed to allow time for other dirty data segments corresponding to the same data line to arrive at the WDB. As such, the eviction criteria can vary depending on memory load, hardware, the nature of the data of the dirty data segment, and the like. Specific nonlimiting examples of eviction criteria can include an event such as a timeout, a WDB full state, all segments of the data line are dirty, a pre-scheduled order, a random order, a sequential order, and the like, including combinations thereof.

The NVM device can include any type of write-in-place NVM. NVM is a storage medium that does not require power to maintain the state of data stored by the medium. NVM has traditionally been used for the task of data storage, or long-term persistent storage, but new and evolving memory technologies allow the use of NVM in roles that extend beyond traditional data storage. One example of such a role is the use of NVM as main or system memory. Non-volatile system memory (NVMsys) can combine data reliability of traditional storage with ultra-low latency and high bandwidth performance, having many advantages over traditional volatile memory, such as high density, large capacity, lower power consumption, and reduced manufacturing complexity, to name a few. Byte-addressable, write-in-place NVM such as three-dimensional (3D) cross-point memory, for example, can operate as byte-addressable memory similar to dynamic random-access memory (DRAM), or as block-addressable memory similar to NAND flash. In other words, such NVM can operate as system memory or as persistent storage memory (NVMstor). In some situations where NVM is functioning as system memory, stored data can be discarded or otherwise rendered unreadable when power to the NVMsys is interrupted. NVMsys also allows increased flexibility in data management by providing non-volatile, low-latency memory that can be located closer to a processor in a computing device. In some examples, NVMsys can reside on a DRAM bus, such that the NVMsys can provide ultra-fast DRAM-like access to data. NVMsys can also be useful in computing environments that frequently access large, complex data sets, and environments that are sensitive to downtime caused by power failures or system crashes.

Nonlimiting examples of NVM can include planar or three-dimensional (3D) NAND flash memory, including single or multi-threshold-level NAND flash memory, NOR flash memory, single or multi-level Phase Change Memory (PCM), such as chalcogenide glass PCM, planar or 3D PCM, cross-point array memory, including 3D cross-point memory, non-volatile dual in-line memory module (NVDIMM)-based memory, such as flash-based (NVDIMM-F) memory, flash/DRAM-based (NVDIMM-N)

memory, persistent memory-based (NVDIMM-P) memory, 3D cross-point-based NVDIMM memory, resistive RAM (ReRAM), including metal-oxide- or oxygen vacancy-based ReRAM, such as $HfO_2$-, $Hf/HfO_x$-, $Ti/HfO_2$-, $TiO_x$-, and $TaO_x$-based ReRAM, filament-based ReRAM, such as $Ag/GeS_2$-, $ZrTe/Al_2O_3$-, and Ag-based ReRAM, programmable metallization cell (PMC) memory, such as conductive-bridging RAM (CBRAM), silicon-oxide-nitride-oxide-silicon (SONOS) memory, ferroelectric RAM (FeRAM), ferroelectric transistor RAM (Fe-TRAM), anti-ferroelectric memory, polymer memory (e.g., ferroelectric polymer memory), magnetoresistive RAM (MRAM), write-in-place non-volatile MRAM (NVMRAM), spin-transfer torque (STT) memory, spin-orbit torque (SOT) memory, nanowire memory, electrically erasable programmable read-only memory (EEPROM), nanotube RAM (NRAM), other memristor- and thyristor-based memory, spintronic magnetic junction-based memory, magnetic tunneling junction (MTJ)-based memory, domain wall (DW)-based memory, and the like, including combinations thereof. The term "memory device" can refer to the die itself and/or to a packaged memory product. NVM can be byte or block addressable. In some examples, NVM can comply with one or more standards promulgated by the Joint Electron Device Engineering Council (JEDEC), such as JESD21-C, JESD218, JESD219, JESD220-1, JESD223B, JESD223-1, or other suitable standard (the JEDEC standards cited herein are available at www.jedec.org). In one specific example, the NVM can be 3D cross-point memory. In another example, the NVM can be NAND or 3D NAND.

In some examples, systems according to the present disclosure can include a host communicatively coupled to the host interface from which a dirty data segment is sent. The host can be any device, circuit, system, controller, node, logic, or the like, including combinations thereof, that can send a dirty data segment to a memory controller. More specific nonlimiting examples can include processors, memory controllers, compute nodes, virtual machines, and the like. As one example, the host can be a processor, which can include a single processor or multiple processors, including single core processors and multi-core processors. A processor can include general purpose processors, specialized processors such as central processing units (CPUs), graphics processing units (GPUs), digital signal processors (DSPs), microcontrollers (MCUs), microprocessors, embedded controllers (ECs), embedded processors, field programmable gate arrays (FPGAs), network processors, hand-held or mobile processors, application-specific instruction set processors (ASIPs), application-specific integrated circuit processors (ASICs), co-processors, and the like. Additionally, a processor can be packaged in numerous configurations, which is not limiting. For example, a processor can be packaged in a common processor package, a multi-core processor package, a system-on-chip (SoC) package, a system-in-package (SiP) package, a system-on-package (SOP) package, and the like.

Figure 10:
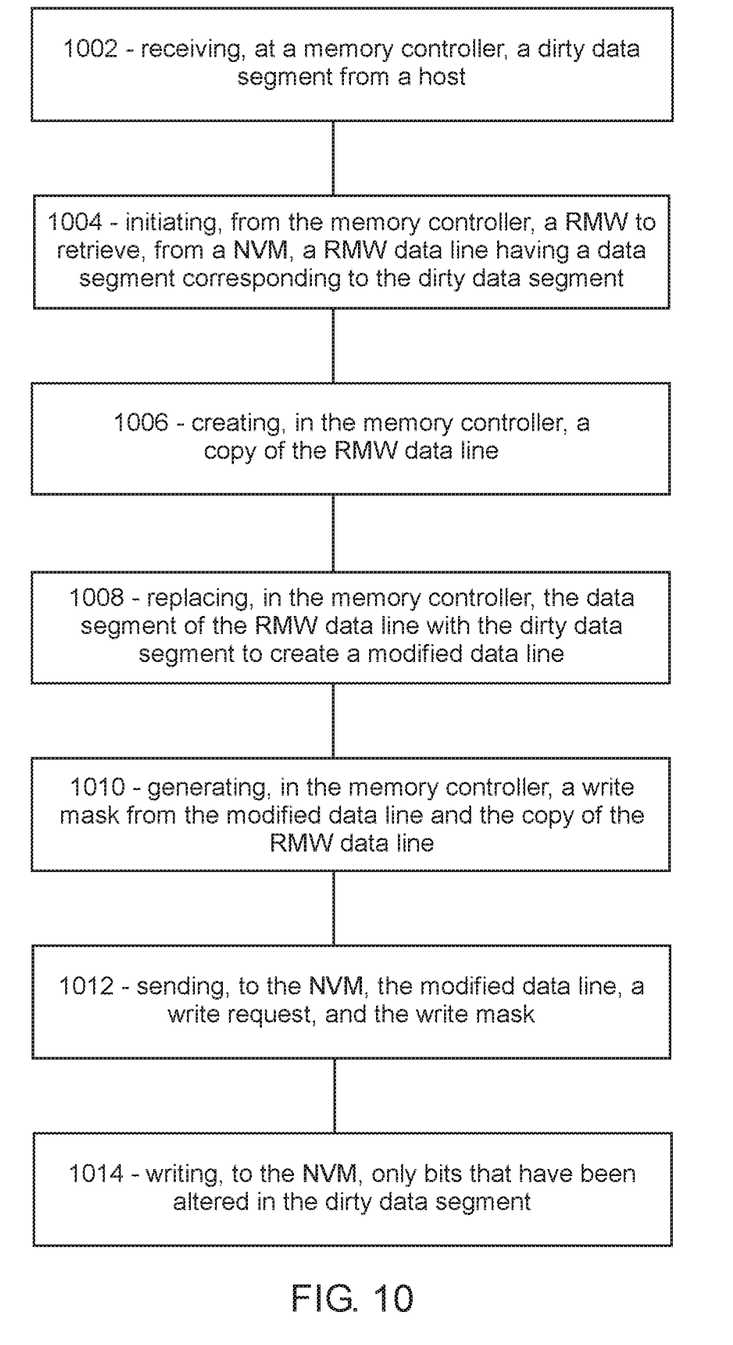
FIG. 10 illustrates a method flow performed by components of a computing system in accordance with an example embodiment.

In another example, a method of increasing the efficiency of selective writing to memory is provided. Such a method can include, as is shown in FIG. 10, 1002 receiving, at a memory controller, a dirty data segment from a host, 1004 initiating, from the memory controller, a RMW operation to retrieve, from a write-in-place NVM, a RMW data line having a data segment corresponding to the dirty data segment, 1006 creating, in the memory controller, a copy of the RMW data line, 1008 replacing, in the memory controller, the data segment of the RMW data line with the dirty data segment to create a modified data line, 1010 generating, in the memory controller, a write mask from the modified data line and the copy of the RMW data line, 1012 sending, to the NVM, the modified data line, a write request, and the write mask, and 1014 writing, to the NVM, only bits that have been altered in the dirty data segment.

Figure 11:
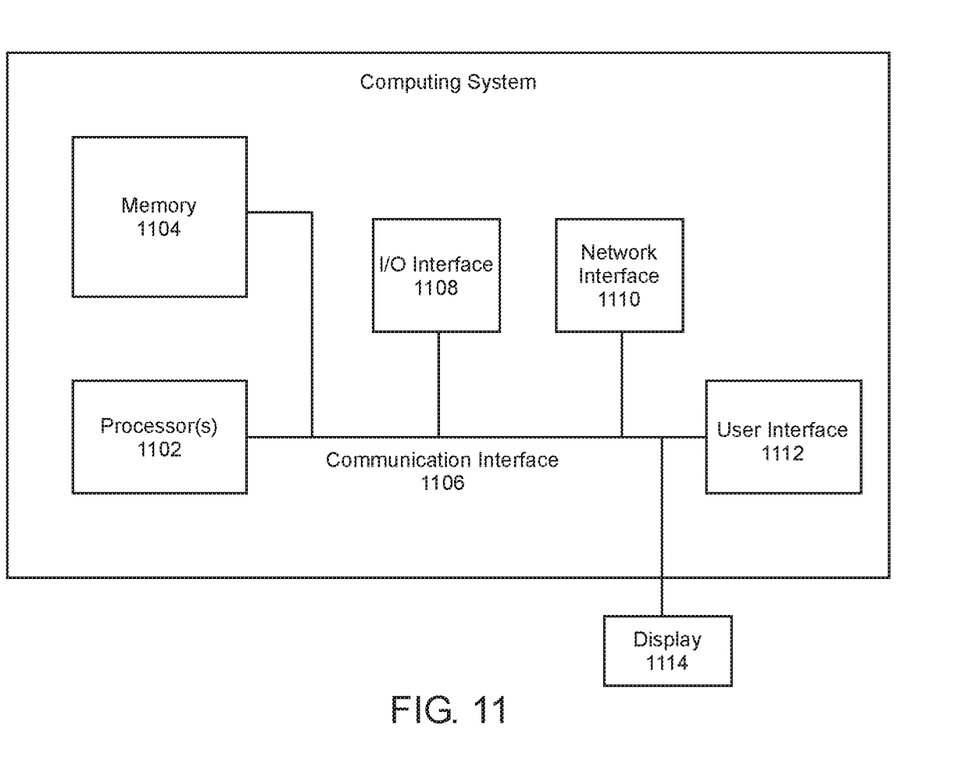
FIG. 11 illustrates a method flow performed by components of a computing system in accordance with an example embodiment.

As another example, FIG. 11 illustrates a general example of a computing system or device that can incorporate the present technology. While any type or configuration of device or computing system is contemplated to be within the present scope, non-limiting examples can include node computing systems, system-on-chip (SoC) systems, system-in-package (SiP) systems, system-on-package (SoP) systems, server systems, networking systems, high capacity computing systems, laptop computers, tablet computers, desktop computers, smart phones, or the like.

The computing system can include one or more processors 1102 in communication with a memory 1104. The memory 1104 can include any device, combination of devices, circuitry, or the like, that is capable of storing, accessing, organizing, and/or retrieving data. Additionally, a communication interface 1106, such as a local communication interface, for example, provides connectivity between the various components of the system. The communication interface 1106 can vary widely depending on the processor, chipset, and memory architectures of the system. For example, the communication interface 1106 can be a local data bus, command/address bus, package interface, or the like.

The computing system can also include an I/O (input/output) interface 1108 for controlling the I/O functions of the system, as well as for I/O connectivity to devices outside of the computing system. A network interface 1110 can also be included for network connectivity. The network interface 1110 can control network communications both within the system and outside of the system, and can include a wired interface, a wireless interface, a Bluetooth interface, optical interface, communication fabric, and the like, including appropriate combinations thereof. Furthermore, the computing system can additionally include a user interface 1112, a display device 1114, as well as various other components that would be beneficial for such a system.

As has been described above, the processor 1102 can be a single processor or multiple processors, including a single core or multiple processor cores, and the memory can be a single memory or multiple memories. The local communication interface 1106 can be used as a pathway to facilitate communication between any of a single processor or processor cores, multiple processors or processor cores, a single memory, multiple memories, the various interfaces, and the like, in any useful combination. In some examples, the communication interface 1106 can be a separate interface between the processor 1102 and one or more other components of the system, such as, for example, the memory 1104. The memory 104 can include system memory that is volatile, nonvolatile, or a combination thereof. The memory 1104 can additionally include NVM utilized as a memory store.

In addition to the NVM types described above, the system can include any type of volatile memory, which is not considered to be limiting. Volatile memory is a storage medium that requires power to maintain the state of data stored by the medium. Nonlimiting examples of volatile memory can include random access memory (RAM), such as static random-access memory (SRAM), dynamic random-access memory (DRAM), synchronous dynamic random-access memory (SDRAM), and the like, including combinations thereof. SDRAM memory can include any variant thereof, such as single data rate SDRAM (SDR DRAM), double data rate (DDR) SDRAM, including DDR, DDR2, DDR3, DDR4, DDR5, and so on, described collectively as DDRx, and low power DDR (LPDDR) SDRAM, including LPDDR, LPDDR2, LPDDR3, LPDDR4, and so on, described collectively as LPDDRx. In some examples, DRAM complies with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209B for LPDDR SDRAM, JESD209-2F for LPDDR2 SDRAM, JESD209-3C for LPDDR3 SDRAM, and JESD209-4A for LPDDR4 SDRAM (these standards are available at www.jedec.org; DDR5 SDRAM is forthcoming). Such standards (and similar standards) may be referred to as DDR-based or LPDDR-based standards, and communication interfaces that implement such standards may be referred to as DDR-based or LPDDR-based interfaces. In one specific example, the system memory can be DRAM. In another specific example, the system memory can be DDRx SDRAM. In yet another specific aspect, the system memory can be LPDDRx SDRAM.

Various techniques, or certain aspects or portions thereof, can take the form of program code (i.e., instructions) embodied in tangible media, such as CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device.

EXAMPLES

The following examples pertain to specific embodiments and point out specific features, elements, or steps that can be used or otherwise combined in achieving such embodiments.

In one example, there is provided a memory apparatus comprising a memory controller to receive a dirty data segment from a host, initiate a read-modify-write (RMW) operation to retrieve a RMW data line having a data segment corresponding to the dirty data segment from a write-in-place non-volatile memory (NVM), create a copy of the RMW data line, replace the data segment of the RMW data line with the dirty data segment to create a modified data line, generate a write mask from the modified data line and the copy of the data line, and send the modified data line, a write request, and the write mask to the NVM to write only bits that have been altered in the dirty data segment.

In one example, the apparatus further comprises a write data buffer (WDB) coupled to the memory controller, wherein the memory controller is further to store the RMW data line in an entry of the WDB, and store the dirty data segment in the entry of the WDB to overwrite the data segment to create the modified data line.

In one example, the apparatus further comprises a RMW buffer communicatively coupled to the WDB and to the memory controller, wherein the memory controller is further to store the copy of the RMW data line in the RMW buffer, wherein the write mask is generated from the modified data line in the WDB and the copy of the RMW data line in the RMW buffer.

In one example of the apparatus, the memory controller is further to store the copy of the RMW data line in the WDB.

In one example of the apparatus, the memory controller is further to maintain the modified data line in the entry of the WDB according to an eviction policy, and evict the modified data line upon the occurrence of an eviction criterion of the eviction policy.

In one example of the apparatus, the memory controller is further to receive a subsequent dirty data segment from the host, determine that the modified data line includes a subsequent data segment corresponding to the subsequent dirty data segment, overwrite the subsequent data segment with the subsequent dirty data segment to incorporate the subsequent dirty data segment in the modified data line, and send, upon eviction from the WDB, the modified data line, the write mask, and the write request to the NVM to write only bits that have been altered in the dirty data segment and the subsequent dirty data segment.

In one example of the apparatus, the eviction criterion can include an event selected from the group consisting of a timeout, a WDB full state, all segments of the data line are dirty, a pre-scheduled order, a random order, and a sequential order.

In one example of the apparatus, wherein, to send the modified data line, the write request, and the write mask, the memory controller is further to send the modified data line, the write request, and the write mask to a media controller at the NVM, where, according to the write mask, only bit lines corresponding to altered bits are driven by the media controller.

In one example of the apparatus, the NVM is three-dimensional (3D) cross-point memory.

In one example, there is provided a memory system comprising a write-in-place non-volatile memory (NVM), a write data buffer (WDB), and a memory controller to communicatively coupled to the NVM and the WDB. The memory controller is to receive a dirty data segment from a host, initiate a read-modify-write (RMW) operation to retrieve a RMW data line having a data segment corresponding to the dirty data segment from the NVM, create a copy of the RMW data line, replace the data segment of the RMW data line with the dirty data segment to create a modified data line, generate a write mask from the modified data line and the copy of the RMW data line, and send the modified data line, a write request, and the write mask to the NVM to write only bits that have been altered in the dirty data segment.

In one example of the system, the memory controller is further to store the RMW data line in an entry of the WDB, and store the dirty data segment in the entry of the WDB to overwrite the data segment to create the modified data line.

In one example, the system further comprises a RMW buffer communicatively coupled to the WDB, wherein the memory controller is further to store the copy of the RMW data line in the RMW buffer, wherein the write mask is generated from the modified data line in the WDB and the copy of the RMW data line in the RMW buffer.

In one example of the system, the memory controller is further to store the copy of the RMW data line in the WDB.

In one example of the system, the memory controller is further to maintain the modified data line in the entry of the WDB according to an eviction policy, and evict the modified data line upon the occurrence of an eviction criterion of the eviction policy.

In one example of the system, the memory controller is further to receive a subsequent dirty data segment from the host, determine that the modified data line includes a subsequent data segment corresponding to the subsequent dirty data segment, overwrite the subsequent data segment with the subsequent dirty data segment to incorporate the subsequent dirty data segment in the modified data line, and send, upon eviction from the WDB, the modified data line, the write mask, and the write request to the NVM to write only bits that have been altered in the dirty data segment and the subsequent dirty data segment.

In one example of the system, the eviction criterion can include an event selected from the group consisting of a timeout, a WDB full state, all segments of the data line are dirty, a pre-scheduled order, a random order, and a sequential order.

In one example of the system, wherein, to send the modified data line, the write request, and the write mask, the memory controller is further to send the modified data line, the write request, and the write mask to a media controller at the NVM, where, according to the write mask, only bit lines corresponding to altered bits are driven by the media controller.

In one example of the system, the NVM is three-dimensional (3D) cross-point array memory.

In one example, there is provided a method of increasing efficiency of selective writing to memory, comprising receiving, at a memory controller, a dirty data segment from a host, initiating, from the memory controller, a read-modify-write (RMW) operation to retrieve, from a write-in-place non-volatile memory (NVM), a RMW data line having a data segment corresponding to the dirty data segment, creating, in the memory controller, a copy of the RMW data line, replacing, in the memory controller, the data segment of the RMW data line with the dirty data segment to create a modified data line, generating, in the memory controller, a write mask from the modified data line and the copy of the RMW data line, sending, to the NVM, the modified data line, a write request, and the write mask, and writing, to the NVM, only bits that have been altered in the dirty data segment.

In one example, the method further comprises storing, in an entry of a write data buffer (WDB) in the memory controller, the RMW data line, and storing the dirty data segment in the entry of the WDB to overwrite the data segment to create the modified data line.

In one example, the method further comprises storing, in a RMW buffer of the memory controller, the copy of the RMW data line, and generating the write mask from the modified data line in the WDB and the copy of the RMW data line in the RMW buffer.

In one example, the method further comprises storing the copy of the RMW data line in the WDB, and generating the write mask from the modified data line in the WDB and the copy of the RMW data line in the WDB.

In one example, the method further comprises maintaining the modified data line in the entry of the WDB according to an eviction policy, and evicting the modified data line upon the occurrence of an eviction criterion of the eviction policy.

In one example, the method further comprises receiving a subsequent dirty data segment from the host, determining that the modified data line includes a subsequent data segment corresponding to the subsequent dirty data segment, overwriting the subsequent data segment with the subsequent dirty data segment to incorporate the subsequent dirty data segment into the modified data line, sending, upon eviction from the WDB, the modified data line, the write mask, and the write request to the NVM, and writing, to the NVM, only bits that have been altered in the dirty data segment and the subsequent dirty data segment.

In one example of the method, the eviction criterion can include an event selected from the group consisting of a timeout, a WDB full state, all segments of the data line are dirty, a pre-scheduled order, a random order, and a sequential order.

In one example of the method, wherein, to send the modified data line, the write request, and the write mask, the method further comprises sending the modified data line, the write request, and the write mask to a media controller at the NVM, activating, by the media controller, only bit lines of the NVM corresponding to altered bits in the dirty data segment according to the write mask, and writing, by the media controller on the activated bit lines, only the altered bits of the dirty data segment to the NVM.

What is claimed is:

1. A memory apparatus, comprising:
   a memory controller to:
   receive a dirty data segment from a host;
   initiate a read-modify-write (RMW) operation to retrieve a RMW data line having a data segment corresponding to the dirty data segment from a write-in-place non-volatile memory (NVM);
   create a copy of the RMW data line;
   replace the data segment of the RMW data line with the dirty data segment to create a modified data line;
   generate a write mask from the modified data line and the copy of the data line; and
   send the modified data line, a write request, and the write mask to the NVM to write only bits that have been altered in the dirty data segment.

2. The apparatus of claim 1, further comprising:
   a write data buffer (WDB) coupled to the memory controller, wherein the memory controller is further to:
   store the RMW data line in an entry of the WDB; and
   store the dirty data segment in the entry of the WDB to overwrite the data segment to create the modified data line.

3. The apparatus of claim 2, further comprising:
   a RMW buffer communicatively coupled to the WDB and to the memory controller, wherein the memory controller is further to:
   store the copy of the RMW data line in the RMW buffer, wherein the write mask is generated from the modified data line in the WDB and the copy of the RMW data line in the RMW buffer.

4. The apparatus of claim 2, wherein the memory controller is further to store the copy of the RMW data line in the WDB.

5. The apparatus of claim 2, wherein the memory controller is further to:
   maintain the modified data line in the entry of the WDB according to an eviction policy; and
   evict the modified data line upon the occurrence of an eviction criterion of the eviction policy.

6. The apparatus of claim 5, wherein the memory controller is further to:
   receive a subsequent dirty data segment from the host;
   determine that the modified data line includes a subsequent data segment corresponding to the subsequent dirty data segment;

overwrite the subsequent data segment with the subsequent dirty data segment to incorporate the subsequent dirty data segment in the modified data line; and send, upon eviction from the WDB, the modified data line, the write mask, and the write request to the NVM to write only bits that have been altered in the dirty data segment and the subsequent dirty data segment.

7. The apparatus of claim 1, wherein, to send the modified data line, the write request, and the write mask, the memory controller is further to:

send the modified data line, the write request, and the write mask to a media controller at the NVM, where, according to the write mask, only bit lines corresponding to altered bits are driven by the media controller.

8. A memory system, comprising:

a write-in-place non-volatile memory (NVM);

a write data buffer (WDB); and a memory controller communicatively coupled to the NVM and the WDB, the memory controller to:

receive a dirty data segment from a host;

initiate a read-modify-write (RMW) operation to retrieve a RMW data line having a data segment corresponding to the dirty data segment from the NVM;

create a copy of the RMW data line;

replace the data segment of the RMW data line with the dirty data segment to create a modified data line;

generate a write mask from the modified data line and the copy of the RMW data line; and send the modified data line, a write request, and the write mask to the NVM to write only bits that have been altered in the dirty data segment.

9. The system of claim 8, wherein the memory controller is further to:

store the RMW data line in an entry of the WDB; and store the dirty data segment in the entry of the WDB to overwrite the data segment to create the modified data line.

10. The system of claim 9, further comprising:

a RMW buffer communicatively coupled to the WDB, wherein the memory controller is further to:

store the copy of the RMW data line in the RMW buffer, wherein the write mask is generated from the modified data line in the WDB and the copy of the RMW data line in the RMW buffer.

11. The system of claim 9, wherein the memory controller is further to store the copy of the RMW data line in the WDB.

12. The system of claim 9, wherein the memory controller is further to:

maintain the modified data line in the entry of the WDB according to an eviction policy; and evict the modified data line upon the occurrence of an eviction criterion of the eviction policy.

13. The system of claim 12, wherein the memory controller is further to:

receive a subsequent dirty data segment from the host;

determine that the modified data line includes a subsequent data segment corresponding to the subsequent dirty data segment;

overwrite the subsequent data segment with the subsequent dirty data segment to incorporate the subsequent dirty data segment in the modified data line; and send, upon eviction from the WDB, the modified data line, the write mask, and the write request to the NVM to write only bits that have been altered in the dirty data segment and the subsequent dirty data segment.

14. The system of claim 8, wherein, to send the modified data line, the write request, and the write mask, the memory controller is further to:

send the modified data line, the write request, and the write mask to a media controller at the NVM, where, according to the write mask, only bit lines corresponding to altered bits are driven by the media controller.

15. The system of claim 8, wherein the NVM is three-dimensional (3D) cross-point array memory.

16. A method of increasing efficiency of selective writing to memory, comprising:

receiving, at a memory controller, a dirty data segment from a host;

initiating, from the memory controller, a read-modify-write (RMW) operation to retrieve, from a write-in-place non-volatile memory (NVM), a RMW data line having a data segment corresponding to the dirty data segment;

creating, in the memory controller, a copy of the RMW data line;

replacing, in the memory controller, the data segment of the RMW data line with the dirty data segment to create a modified data line;

generating, in the memory controller, a write mask from the modified data line and the copy of the RMW data line;

sending, to the NVM, the modified data line, a write request, and the write mask; and writing, to the NVM, only bits that have been altered in the dirty data segment.

17. The method of claim 16, further comprising:

storing, in an entry of a write data buffer (WDB) in the memory controller, the RMW data line; and storing the dirty data segment in the entry of the WDB to overwrite the data segment to create the modified data line.

18. The method of claim 17, further comprising:

storing, in a RMW buffer of the memory controller, the copy of the RMW data line; and generating the write mask from the modified data line in the WDB and the copy of the RMW data line in the RMW buffer.

19. The method of claim 17, further comprising:

storing the copy of the RMW data line in the WDB; and generating the write mask from the modified data line in the WDB and the copy of the RMW data line in the WDB.

20. The method of claim 17, further comprising:

maintaining the modified data line in the entry of the WDB according to an eviction policy; and evicting the modified data line upon the occurrence of an eviction criterion of the eviction policy.

21. The method of claim 20, further comprising:

receiving a subsequent dirty data segment from the host;

determining that the modified data line includes a subsequent data segment corresponding to the subsequent dirty data segment;

overwriting the subsequent data segment with the subsequent dirty data segment to incorporate the subsequent dirty data segment into the modified data line;

sending, upon eviction from the WDB, the modified data line, the write mask, and the write request to the NVM; and writing, to the NVM, only bits that have been altered in the dirty data segment and the subsequent dirty data segment.

22. The method of claim 20, wherein the eviction criterion can include an event selected from the group consisting of a timeout, a WDB full state, all segments of the data line are dirty, a pre-scheduled order, a random order, and a sequential order.

23. The method of claim 16, wherein, to send the modified data line, the write request, and the write mask, the method further comprises:
- sending the modified data line, the write request, and the write mask to a media controller at the NVM;
- activating, by the media controller, only bit lines of the NVM corresponding to altered bits in the dirty data segment according to the write mask; and
- writing, by the media controller on the activated bit lines, only the altered bits of the dirty data segment to the NVM.

* * * * *